(12) United States Patent
Yoshimoto et al.

(10) Patent No.: US 9,691,689 B2
(45) Date of Patent: Jun. 27, 2017

(54) LEAD FRAME FOR MOUNTING SEMICONDUCTOR ELEMENT AND METHOD FOR MANUFACTURING THE SAME

(71) Applicant: SH MATERIALS CO., LTD., Tokyo (JP)

(72) Inventors: Ryouichi Yoshimoto, Isa (JP); Ryohei Yamashita, Anan (JP)

(73) Assignee: SH MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/777,844

(22) PCT Filed: Mar. 18, 2014

(86) PCT No.: PCT/JP2014/057315
§ 371 (c)(1),
(2) Date: Sep. 17, 2015

(87) PCT Pub. No.: WO2014/148484
PCT Pub. Date: Sep. 25, 2014

(65) Prior Publication Data
US 2016/0276252 A1 Sep. 22, 2016

(30) Foreign Application Priority Data
Mar. 18, 2013 (JP) .................................. 2013-055771

(51) Int. Cl.
*H01L 23/495* (2006.01)
*H01L 21/48* (2006.01)

(52) U.S. Cl.
CPC .... *H01L 23/49548* (2013.01); *H01L 21/4828* (2013.01); *H01L 23/4952* (2013.01);
(Continued)

(58) Field of Classification Search
CPC ......... H01L 23/49548; H01L 23/49503; H01L 23/4952; H01L 23/49541
(Continued)

(56) References Cited

U.S. PATENT DOCUMENTS 4,862,246 A * 8/1989 Masuda ............. H01L 21/4828
174/536
5,866,939 A * 2/1999 Shin .................... H01L 23/3114
257/666

(Continued)

FOREIGN PATENT DOCUMENTS

JP 4-57348 A 2/1992
JP 2002-208664 A 7/2002
(Continued)

OTHER PUBLICATIONS

PCT International Search Report dated Jun. 11, 2014 issued during the prosecution of the corresponding PCT International Application No. PCT/JP2014/057315.

*Primary Examiner* — Nitin Parekh
(74) *Attorney, Agent, or Firm* — Troutman Sanders LLP (57) ABSTRACT

A lead frame for mounting semiconductor element includes a protrusion that is horizontally projects from edges of the upper and lower surfaces of a semiconductor-mounting part or a terminal part of the lead frame and that is provided on a lateral side of at least one of the semiconductor-mounting part or the terminal part of the lead frame, wherein the top end of the protrusion is substantially flat or the profile of the cross section of the top end is arc-shaped, and the top end of the protrusion is thick.

10 Claims, 6 Drawing Sheets

(52) U.S. Cl.
CPC .. *H01L 23/49503* (2013.01); *H01L 23/49541* (2013.01); *H01L 23/49582* (2013.01); *H01L 2924/0002* (2013.01)

(58) Field of Classification Search
USPC ........................................................ 257/666
See application file for complete search history.

(56) References Cited

U.S. PATENT DOCUMENTS

| | | | | |
|---|---|---|---|---|
| 5,977,630 | A * | 11/1999 | Woodworth | H01L 23/4334 257/666 |
| 6,025,560 | A * | 2/2000 | De Buyst | H02G 15/103 174/88 C |
| 6,281,568 | B1 * | 8/2001 | Glenn | H01L 23/3107 257/666 |
| 6,433,277 | B1 * | 8/2002 | Glenn | H01L 21/4842 174/537 |
| 6,684,496 | B2 * | 2/2004 | Glenn | H01L 21/4842 174/529 |
| 6,714,839 | B2 * | 3/2004 | Salisbury, Jr. | B25J 3/00 318/568.11 |
| 2002/0121684 | A1 | 9/2002 | Kobayakawa | |
| 2004/0164395 | A1 | 8/2004 | Kobayakawa | |
| 2004/0238923 | A1 * | 12/2004 | Lee | H01L 23/3107 257/670 |
| 2006/0043613 | A1 | 3/2006 | Kobayakawa | |
| 2012/0074547 | A1 * | 3/2012 | Do | H01L 21/4832 257/676 |

FOREIGN PATENT DOCUMENTS

| | | |
|---|---|---|
| JP | 2011-151069 A | 8/2011 |
| JP | 2012-164877 A | 8/2012 |
| JP | 2012-182207 A | 9/2012 |

* cited by examiner

| ETCHING CONDITION | ETCHING AMOUNT: LARGE | ETCHING AMOUNT: NORMAL | ETCHING AMOUNT: SMALL |
|---|---|---|---|
| CROSS-SECTIONAL APPEARANCE | | | |
| PROTRUSION WIDTH: E | 0.040mm | 0.070mm | 0.090mm |
| PROTRUSION THICKNESS: F | 0.030mm | 0.050mm | 0.065mm |
| PROTRUSION HEIGHT: G | 0.115mm | 0.100mm | 0.085mm |

LEAD FRAME FOR MOUNTING SEMICONDUCTOR ELEMENT AND METHOD FOR MANUFACTURING THE SAME

CROSS-REFERENCE TO RELATED APPLICATION

This is a U.S. national phase application under 35 U.S.C §371 of International Patent Application No. PCT/JP2014/057315, filed on Mar. 18, 2014, and claims benefit of priority of Japanese Patent Application No. JP 2013-055771, filed on Mar. 18, 2013. The international Application was published on Sep. 25, 2014, as International Publication No. WO 2014/148484 under PCT Article 21(2). The entire contents of these Applications are hereby incorporated herein by reference.

FIELD OF THE INVENTION

This invention relates to a lead frame for mounting semiconductor element, particularly, to the shapes of a semiconductor mounting part and a terminal part of the lead frame.

BACKGROUND OF THE INVENTION

For lead frames on which semiconductor elements are mounted, it is one of the important points for improving the reliability of products to improve adhesiveness of sealing resin to the terminal parts that are connected to semiconductor elements and to the outside. Accordingly, various technologies for improving adhesiveness of resin to prevent the terminal parts from coming out have been proposed. Specifically, these technologies include: a technology of forming a protrusion (eave-shaped portion) on the upper surface of terminal; and a technology of roughening the lateral surface of terminal.

For example, Japanese Patent Kokai No. 2011-151069 discloses a technology of making a lateral surface of a substrate rough by giving an etching treatment from the front and back surfaces of the substrate. This technology is a technology capable of coping with the above-described problem by making a difference between etching masks used for the front and back surfaces in a conventional etching process that has been performed in the prior art. In the technology disclosed in Japanese Patent Kokai No. 2011-151069, its objective is achieved by making a lead frame with etching masks that are formed in such a way that an etching mask used for the front surface is given narrow openings and an etching mask used for the back surface is given wide openings when the etching process is performed by the length substantially equal to or smaller than the thickness of the metal substrate.

Now, in the case where lead frames are made by the prior arts, a protrusion has to be formed in such a way that: the top end of the protrusion is substantially flat; or the cross section of the protrusion has an arc-like profile, because a crack occurs in a sealing resin in the case where the top end of the protrusion is sharp even though the protrusion is formed in order to improve adhesiveness of resin to terminal parts.

In the case of QFN (quad flat non-leaded package) or lead frames for LED in particular, an edge face of a device-mounting plane is designed to overhang an edge face of a plane that is exposed after semiconductor packaging, to function as one of measures for preventing resin from peeling off from a lead frame. However, the trouble which is acknowledged as problem in the present field is that resin inevitably peels off from a lead frame because of influences of: expansion or contraction of resin due to thermal history at high temperatures; and vibration, the expansion or contraction and vibration occurring due to friction between a lead frame sheet and a blade when the lead frame sheet is cut off into strips. Accordingly the marketplace in this field requires better improvement of adhesiveness of resin to lead frame.

Accordingly, the present invention is made in view of the above-described problem. The objective of the present invention is to offer a lead frame for mounting semiconductor element which effectively satisfies adhesiveness of sealing resin to lead frame.

SUMMARY OF THE INVENTION

In order to achieve the above-described objective, a lead frame for mounting semiconductor element according to one of embodiments of the present invention is characterized: in that the lead frame includes a protrusion that is provided on one of or both of lateral sides of at least one of its semiconductor-mounting part and its terminal part and that horizontally projects from edges of upper and lower surfaces of the semiconductor-mounting part or the terminal part; and in that the protrusion is formed in such a way that: the top end of the protrusion is approximately flat or the cross section of the top end of the protrusion has an arc-like profile; and the top end of the protrusion is thick.

Also, a lead frame for mounting semiconductor element according to one of the embodiments of the present invention is characterized in that a protrusion is formed on one of or both of lateral sides of at least one of its semiconductor-mounting part and its terminal part, in that the upper side of the protrusion horizontally projects beyond an edge of the lower surface of the semiconductor-mounting part or the terminal part, in that the protrusion runs slantingly and downward from the lower side of the projecting upper side of the protrusion so that the protrusion horizontally projects beyond an edge of the upper surface of the semiconductor-mounting part or the terminal part and also projects downward from the upper side, and in that the top end of the protrusion is 25 μm or more in thickness and is rounded.

Also, a lead frame for mounting semiconductor element according to one of the embodiments of the present invention is characterized in that a protrusion is formed on a lateral side of at least one of its semiconductor-mounting part and its terminal part, in that the upper side of the protrusion horizontally projects beyond an edge of the lower surface of the semiconductor-mounting part or the terminal part, in that the protrusion horizontally projects on the lower side of the projecting upper side of the protrusion beyond also an edge of the upper surface of the semiconductor-mounting part or the terminal part, and in that the protrusion further includes a portion running downward from a lower-side corner of the top end of the protrusion.

According to one embodiment of the present invention, a protrusion is formed on a lateral surface of the semiconductor-mounting part or the terminal part to run not only horizontally but also vertically, so that the protrusion makes lead frame have high tolerance for stress in all directions and increases a contact area between the metal substrate and resin. As a result, it is possible to prevent the resin from peeling off from the metal substrate due to expansion or contraction caused by thermal history when a lead frame sheet is cut off into strips or due to vibration occurring when the lead frame sheet is cut off into strips.

DETAILED DESCRIPTION OF THE INVENTION

A process of forming a pattern of the lead frame according to one embodiment of the present invention is characterized in that the process includes: a step of forming semiconductor-mounting parts and terminal parts on the surface of a metal substrate for lead frame in such a way that a photo sensitive resist layer is put on the metal substrate 1 for lead frame that is given alkaline-acid treatment and the photo sensitive resist layer is exposed with a mask for manufacturing lead frame which includes a pattern for forming protrusions so that the pattern is printed on the surface of the metal substrate; and a step of forming the shapes of lead frames each of which includes a protrusion on one of or both of the lateral sides of the semiconductor-mounting part or the terminal part by giving the metal substrate 1 for lead frame an etching treatment.

Regarding a method of forming the protrusions 4, for example, the present inventors performed an etching process after forming resist layers with extremely narrow widths in the vicinity of the lateral sides of portions that were given shape patterns of the semiconductor-mounting parts respectively so that portions of the metal substrate for forming protrusions on which the resist layers for forming protrusions were formed were made to dissolve by the etching process slower than portions of the metal substrate for forming another parts except the protrusions did, and then the present inventors tried to form the protrusions after formation of the shapes of another parts expect the protrusions was completed.

Figure 1:
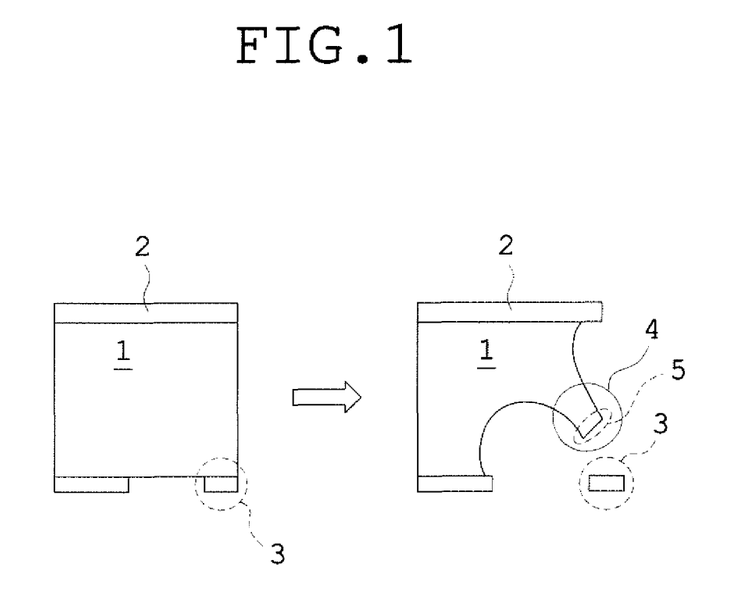
FIG. 1 is a view for explaining a process of formation of a protrusion through trial example leading to the present invention, while a primary part is being enlarged.
Figure 2:
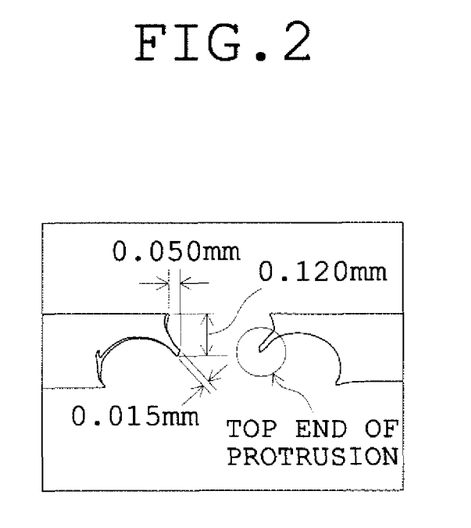
FIG. 2 is a view for explaining the shape and size of the top end of the protrusion formed in the process which is shown in FIG. 1, while the primary part is being enlarged.

In forming the protrusions by the above-described method, as shown in FIG. 1, the resist layers 2 are formed on surface areas including the semiconductor-mounting parts and the resist layers 3 with extremely narrow widths are formed also on the opposite surface areas, or on the surface areas that are exposed to the outside after sealing with resin, and then the metal substrate having the resist layers is given an etching treatment. As a result, the protrusions 4 running horizontally from the surface areas including the semiconductor-mounting parts (packaging surface) and running vertically (downward) can be formed. However, the thicknesses of the formed protrusions 4 range from 10 μm to 15 μm and are very thin, and even slight difference in etching condition causes large variations in workmanship of the shapes of the protrusions, so that the protrusions may inevitably disappear and it is hard to keep the protrusions. Also, the top ends of the protrusions 4 have sharp shapes, so that there is a large fear that the top ends of the protrusions having sharp shapes might cause crack after sealing with resin (refer to FIG. 2 and the left-side figure of FIG. 3).

Figure 3:
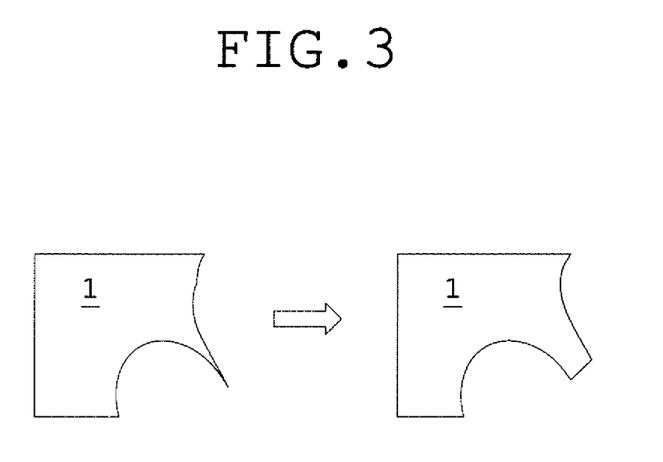
FIG. 3 is an explanatory view for explaining formation of the protrusion according to one embodiment of the present invention.
Figure 4:
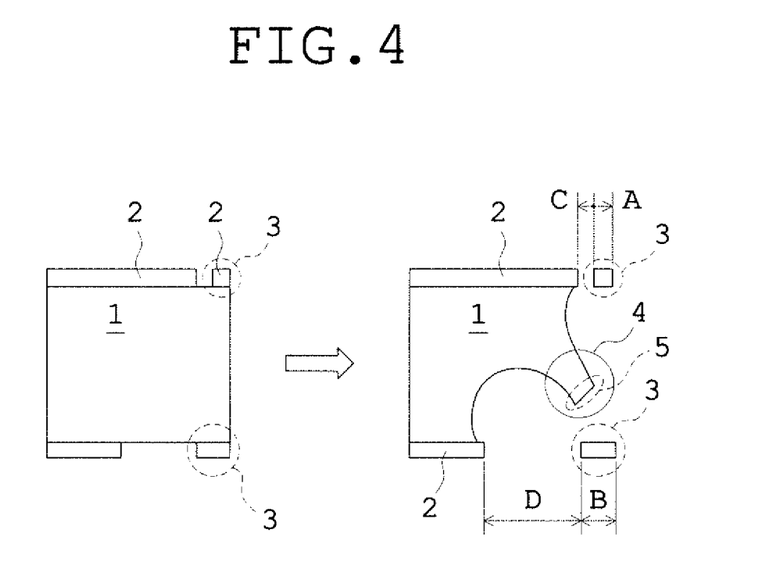
FIG. 4 is a view for explaining a process of formation of the protrusion according to one embodiment of the present invention, while the primary part is being enlarged.

In order to avoid this matter, so that there is necessity to create condition to stably form the protrusions despite variations in etching conditions so as to make the thicknesses of the protrusions 4 as thick as possible, as shown in the right-side figure of FIG. 3. As a method for overcoming the above-described problem, the present inventors tried to form the resist layers 3 having extremely narrow widths not only on the surface that is exposed to the outside after sealing with resin but also on the surface on which packaging is performed so that the thicknesses of the protrusions formed after etching treatment become thick, as shown in FIG. 4. In this case, the conditions of the metal substrate 1 and the etching resist patterns 2 and 3 are same as those in embodiments 1, 4, and 5 which are explained below. As a result, the present inventors could make protrusions of 50 μm in thickness (refer to the middle part of the list shown in FIG. 5). In addition, the present inventors increased or decreased an amount of etching intentionally to confirm whether the protrusions disappeared or not. As a result, thick protrusions of 30 μm in thickness could be formed even though an amount of etching was increased (refer to the left part of the list shown in FIG. 5).

Figure 5:
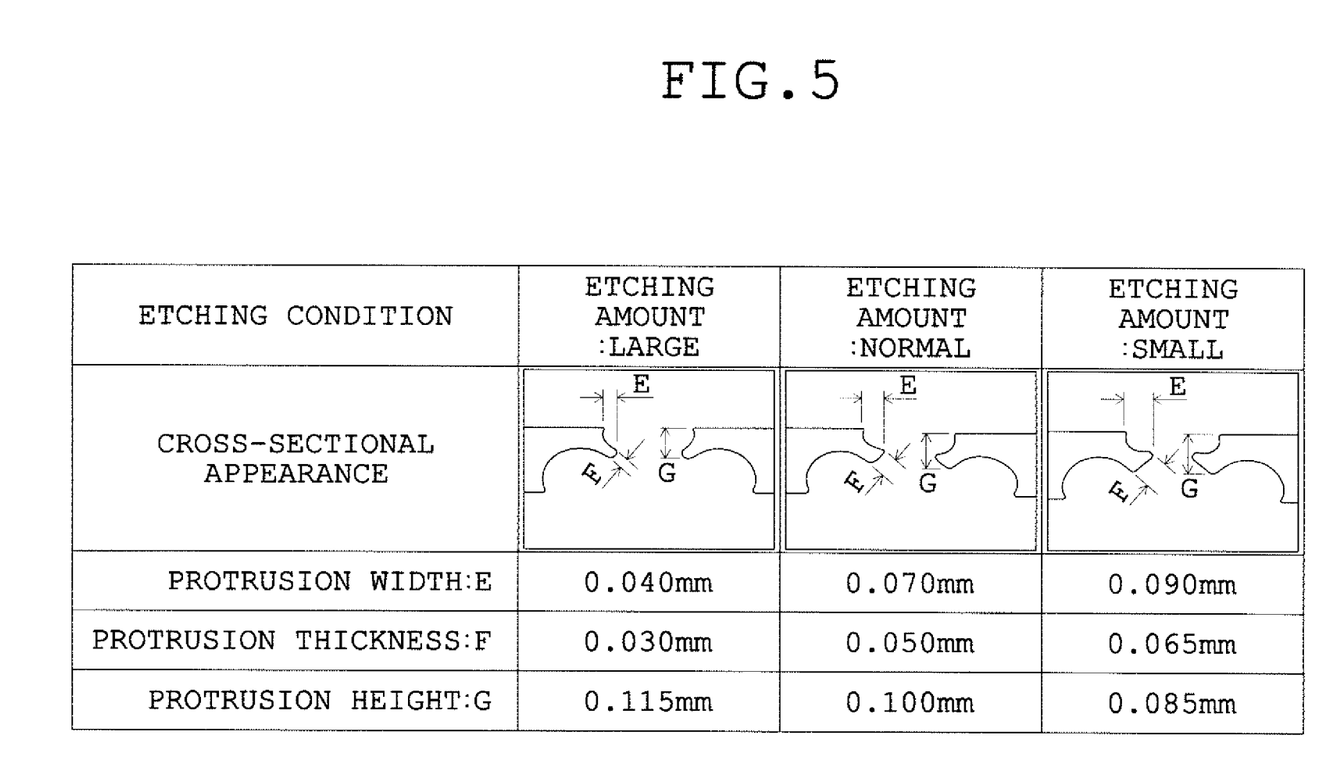
FIG. 5 is a list showing the relation between: etching conditions for forming the protrusion according to one embodiment of the present invention; and variations in shape and size of the cross section of protrusion.

Also, the top end 5 of each of the protrusions 4 does not have a sharp shape but has a rounded shape (refer to the left-side part or the middle part of the list shown in FIG. 5) or an approximately plane-like shape (refer to the right-side part of the list shown in FIG. 5), and the present inventors could confirm that such a method made it possible to prevent crack in resin from occurring from the top end 5 of the protrusion after sealing with resin.

The case where the protrusion 4 is formed on one lateral side of each of the semiconductor-mounting parts was explained up to now. However, it goes without saying that protrusions can be formed on the both lateral sides of a semiconductor-mounting part or on one of and/or both of lateral sides of a terminal part in the same manner.

Embodiment 1

A band-shaped cupper material (KLF-194: made by Kobe Steel, Ltd.) having a thickness of 0.2 mm and a width of 180 mm was used as a metal substrate 1 for lead frame, and photo sensitive resist layers (negative-type photo sensitive resist AQ-2058: made by Asahi Kasei E-materials Corporation.) each having a thickness of 20 μm were formed on the both surfaces of this metal substrate respectively. And then, in order to form a protrusion 4, the both surfaces of the metal substrate 1 that were given the photo sensitive resist layers respectively were exposed to be developed through glass masks (HY2-50P: made by KONIKA MINOLTA ADVANCED LAYERS, INC.), one of the glass masks having been given a design for lead frame which included a pattern for forming an etching resist pattern layer having a width A of 40 μm on the packaging-surface side and the other of the glass masks having been given a design for lead frame which included a pattern for forming an etching resist pattern layer having a width B of 80 μm on the other-surface side which was exposed to the outside after sealing with resin (refer to FIG. 4), so that etching resist pattern layers for lead frame each having an etching resist pattern for forming a protrusion 4 (dummy pattern for controlling etching rate) were formed. And then, the metal substrate 1 having been provided with the etching resist pattern layers that had the patterns for forming protrusion was given an etching process. As a result, the extremely thin etching resist layers 3 for forming protrusion which were given on the both surfaces of the metal substrate 1 slowed down progress of etching for the portion, so that a shape of lead frame which included a protrusion 4 having a width E of 70 μm (an amount of the protrusion projecting from the edge of the upper surface in the horizontal direction), a height G of 100 μm (an amount of the protrusion projecting from the upper surface in the downward direction), and a thickness F of 50 μm was formed. Afterward, the etching resist layers were removed from the metal substrate, so that a band-shaped copper lead frame was obtained (refer to the central part of the list shown in FIG. 5). In this case, an opening between the etching resist layer 2 for forming lead frame and the etching resist layer 3 for forming the protrusion 4 was formed to have a width C of 40 μm on the packaging-surface side, and an opening between the etching resist layer 2 for forming lead frame and the etching resist layer 3 for forming the protrusion 4 was formed to have a width D of 120 μm on the other-surface side which was exposed to the outside after sealing with resin (refer to FIG. 4). Afterward, the band-shaped lead frame was plated with metal as it was, to have extremely thin metal layers. Afterward, the band-shaped lead frame was cut off into fine pieces along its transverse direction, and then resin tapes for fixing sealing resin were stuck on these fine pieces respectively, to obtain finished lead frame sheets.

Embodiment 2

Figure 6:
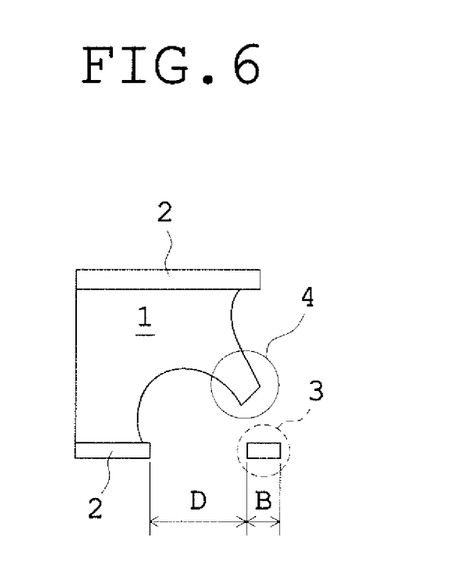
FIG. 6 is a view for explaining a process of formation of a protrusion according to another embodiment of the present invention, while the primary part is being enlarged.
Figure 7:
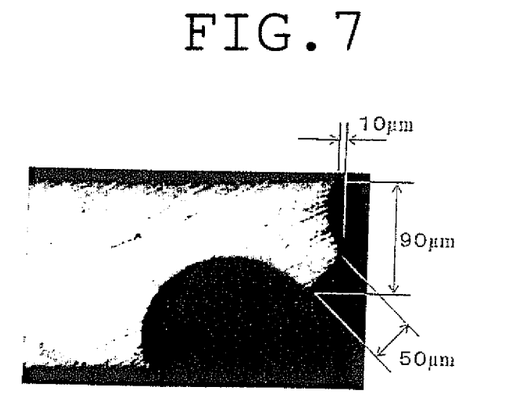
FIG. 7 is a photograph for explaining the shape and size of a protrusion according to an embodiment 2 of the present invention, while a primary part is being enlarged.

A band-shaped cupper material (KLF-194: made by Kobe Steel, Ltd.) having a thickness of 0.2 mm and a width of 180 mm was used as a metal substrate 1 for lead frame, and photo sensitive resist layers (negative-type photo sensitive resist AQ-2058: made by Asahi Kasei E-materials Corporation.) each having a thickness of 20 μm were formed on the both surfaces of this metal substrate 1 respectively. And then, in order to form a protrusion 4, the both surfaces of the metal substrate 1 that were given the photo sensitive resist layers respectively were exposed to be developed through glass masks (HY2-50P: made by KONIKA MINOLTA ADVANCED LAYERS, INC.), one of the glass masks having been given a design for lead frame which included a pattern for forming an etching resist pattern layer 3 having a width B of 90 μm only on the surface side which was exposed to the outside after sealing with resin, so that an etching resist pattern layer for lead frame having an etching resist pattern for forming a protrusion 4 (dummy pattern for controlling etching rate) was formed. And then, the metal substrate 1 having been provided with the etching resist pattern layer that had the patterns for forming protrusion was given an etching process. As a result, the etching resist layers 3 for forming protrusion, which were given on the both surfaces of the metal substrate 1 and each of which had the width B of 90 μm, slowed down progress of etching for the portion, so that a shape of lead frame which included a protrusion 4 having a width E of 10 μm (an amount of the protrusion projecting from the edge of the upper surface in the horizontal direction), a height G of 90 μm (an amount of the protrusion projecting from the upper surface in the downward direction), and a thickness F of 50 μm was formed. Afterward, the etching resist layers were removed from the metal substrate, so that a band-shaped copper lead frame was obtained (refer to FIGS. 6 and 7). The width of the protrusion 4 in the embodiment 2 was narrower than that of the protrusion 4 in the embodiment 1 but the protrusion 4 in the embodiment 2 was finished so that the height of the protrusion 4 in the embodiment 2 was approximately equal to that of the protrusion 4 in the embodiment 1. In this case, an opening between the etching resist pattern layer 2 for forming lead frame and the etching resist layer 3 for forming the protrusion 4 was formed to have a width D of 95 μm. Afterward, the etching resist pattern layers were peeled off, the band-shaped lead frame was plated with metal as it was, to have extremely thin metal layers. Afterward, the band-shaped lead frame was cut off into fine pieces along its transverse direction, and then resin tapes for fixing sealing resin were stuck on these fine pieces respectively, to obtain finished lead frame sheets.

Embodiment 3

Figure 8:
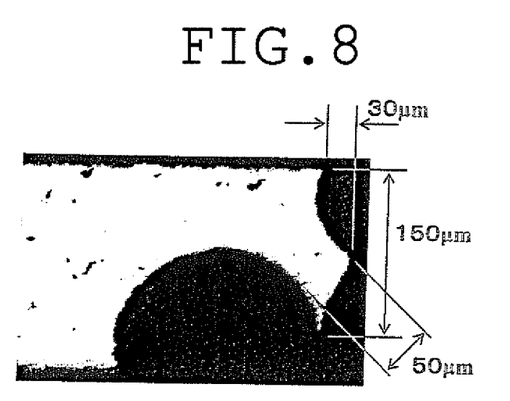
FIG. 8 is a photograph for explaining the shape and size of a protrusion according to an embodiment 3 of the present invention, while the primary part is being enlarged.

A band-shaped cupper material (KLF-194: made by Kobe Steel, Ltd.) having a thickness of 0.2 mm and a width of 180 mm was used as a metal substrate 1 for lead frame, and photo sensitive resist layers (negative-type photo sensitive resist AQ-2058: made by Asahi Kasei E-materials Corporation.) each having a thickness of 20 μm were formed on the both surfaces of this metal substrate 1 respectively. And then, in order to form a protrusion 4, the both surfaces of the metal substrate 1 that were given the photo sensitive resist layers respectively were exposed to be developed through glass masks (HY2-50P: made by KONIKA MINOLTA ADVANCED LAYERS, INC.), one of the glass masks having been given a design for lead frame which included a pattern for forming an etching resist pattern layer having a width A of 55 μm on the packaging-surface side and the other of the glass masks having been given a design for lead frame which included a pattern for forming an etching resist pattern layer having a width B of 100 μm on the other-surface side which was exposed to the outside after sealing with resin (refer to FIG. 4), so that etching resist pattern layers for lead frame each having an etching resist pattern for forming a protrusion 4 (dummy pattern for controlling etching rate) were formed. And then, the metal substrate 1 having been provided with the etching resist pattern layers that had the patterns for forming protrusion was given an etching process. As a result, the extremely thin etching resist layers 3 for forming protrusion which were given on the both surfaces of the metal substrate 1 slowed down progress of etching for the portion, so that a shape of lead frame which included a protrusion 4 having a width E of 30 μm (an amount of the protrusion projecting from the edge of the upper surface in the horizontal direction), a height G of 150 μm (an amount of the protrusion projecting from the upper surface in the downward direction), and a thickness F of 50 μm was formed. Afterward, the etching resist layers were peeled off, so that a band-shaped copper lead frame was obtained (refer to FIGS. 4 and 8). In this case, an opening between the etching resist layer 2 for forming lead frame and the etching resist layer 3 for forming the protrusion 4 was formed to have a width C of 30 μm on the packaging-surface side, and an opening between the etching resist layer 2 for forming lead frame and the etching resist layer 3 for forming the protrusion 4 was formed to have a width D of 115 μm on the other-surface side which was exposed to the outside after sealing with resin (refer to FIG. 4). Afterward, the band-shaped lead frame was plated with metal as it was, to have extremely thin metal layers. Afterward, the etching resist pattern layers were peeled off, and the band-shaped lead frame was cut off into fine pieces along its transverse direction, and then resin tapes for fixing sealing resin were stuck on these fine pieces respectively, to obtain finished lead frame sheets.

Embodiment 4

Figure 9:
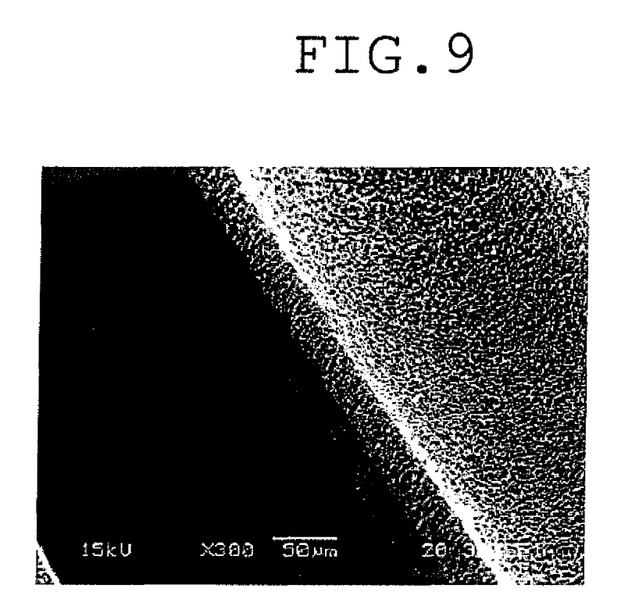
FIG. 9 is a photograph obtained by photographing the protrusion from the side of an exposed surface after sealing with resin, more specifically, at an angle at which a camera faces squarely to the top end of the protrusion, in order to show a state of rough surface in one embodiment of the present invention.
Figure 10:
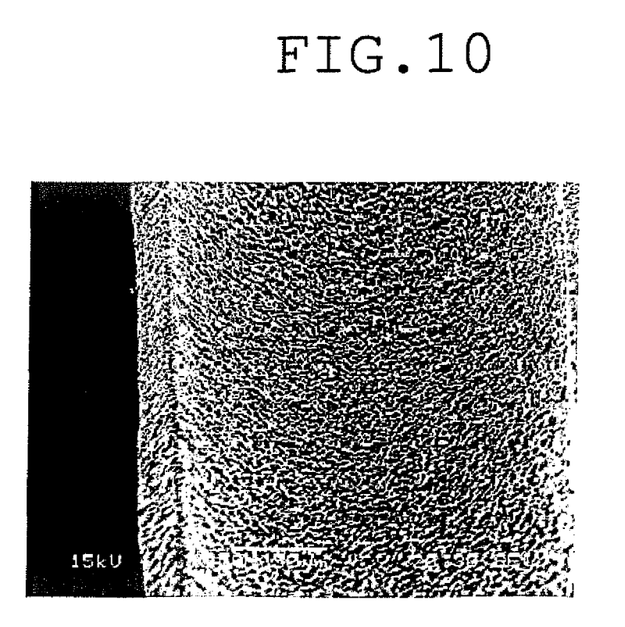
FIG. 10 is a photograph obtained by photographing the under-side surface of the protrusion which is roughened and shown in FIG. 9, from just below the under-side surface of the protrusion (and at an angle perpendicular to the surface of the metal substrate from the exposed-surface side before processing the surface of the metal substrate).

A band-shaped cupper material (KLF-194: made by Kobe Steel, Ltd.) having a thickness of 0.2 mm and a width of 180 mm was used as a metal substrate 1 for lead frame, and photo sensitive resist layers (negative-type photo sensitive resist AQ-2058: made by Asahi Kasei E-materials Corporation.) each having a thickness of 20 μm were formed on the both surfaces of this metal substrate 1 respectively. And then, in order to form a protrusion 4, the both surfaces of the metal substrate 1 that were given the photo sensitive resist layers respectively were exposed to be developed through glass masks (HY2-50P: made by KONIKA MINOLTA ADVANCED LAYERS, INC.), one of the glass masks having been given a design for lead frame which included a pattern for forming an etching resist pattern layer having a width A of 40 μm (dummy pattern for controlling etching rate) on the packaging-surface side and the other of the glass masks having been given a design for lead frame which included a pattern for forming an etching resist pattern layer having a width B of 80 μm (dummy pattern for controlling etching rate) on the other-surface side which was exposed to the outside after sealing with resin (refer to FIG. 4), so that etching resist pattern layers for lead frame each having an etching resist pattern for forming a protrusion 4 were formed. And then, the metal substrate 1 having been provided with the etching resist pattern layers that had the patterns for forming protrusion was given an etching process. As a result, the extremely thin etching resist layers 3 for forming protrusion which were given on the both surfaces of the metal substrate 1 slowed down progress of etching for the portion, so that a shape of lead frame which included a protrusion 4 having a width E of 70 μm (an amount of the protrusion projecting from the edge of the upper surface in the horizontal direction), a height G of 100 μm (an amount of the protrusion projecting from the upper surface in the downward direction), and a thickness F of 50 μm was formed (refer to the central part of the list shown in FIG. 5). Afterward, the etching resist pattern layers were not removed from the metal substrate to be kept on the metal substrate. In this case, an opening between the etching resist layer 2 for forming lead frame and the etching resist layer 3 for forming the protrusion 4 was formed to have a width C of 40 μm on the packaging-surface side, and an opening between the etching resist layer 2 for forming lead frame and the etching resist layer 3 for forming the protrusion 4 was formed to have a width D of 120 μm on the other-surface side which was exposed to the outside after sealing with resin (refer to FIG. 4). Afterward, portions of the surface of the band-shaped lead frame which were not covered with the etching resist pattern layers and which included protrusions were roughened with a roughening solution of an organic acid system or a hydrogen peroxide-sulfic acid system so that the portions of the surface of band-shaped lead frame which were not covered with the etching resist pattern layers had a roughness average (Ra) of 0.12 to 0.2 μm, with the etching resist pattern layers not removed from the band-shaped lead frame, to obtain the lead frame having more improved adhesiveness of resin to the lead frame (refer to FIGS. 9 and 10). Afterward, the etching resist pattern layers were peeled off, and the band-shaped lead frame was plated with metal as it was, to have extremely thin metal layers. Afterward, the band-shaped lead frame was cut off into fine pieces along its transverse direction, and then resin tapes for fixing sealing resin were stuck on these fine pieces respectively, to obtain finished lead frame sheets.

Embodiment 5

A band-shaped cupper material (KLF-194: made by Kobe Steel, Ltd.) having a thickness of 0.2 mm and a width of 180 mm was used as a metal substrate 1 for lead frame, and photo sensitive resist layers (negative-type photo sensitive resist AQ-2058: made by Asahi Kasei E-materials Corporation.) each having a thickness of 20 μm were formed on the both surfaces of this metal substrate respectively. And, glass masks each having a pattern for plating parts of a lead frame were covered with the front and back surfaces of the metal substrate 1 respectively, with the patterns of the glass masks properly positioned respectively, and then the both surfaces of the metal substrate 1 were exposed to ultraviolet rays through the glass masks. After the exposure to ultraviolet rays, the glass masks were removed from the metal substrate 1, and then the metal substrate with the light sensitive resist layers was immersed in a developer so that the photo sensitive resist layers were developed. As a result, only portions of the photo sensitive resist layers which had been not exposed to ultraviolet rays, or only portions of the photo sensitive resist layers corresponding to portions which were plated to be a semiconductor-mounting part, a terminal part or the like, were removed from the metal substrate, so that plating resist layers were obtained. Next, the metal substrate with the plating resist layers was put in a plating tank so that the metal portions of the metal substrate which were exposed to the outside were plated with Ag to be given Ag-plating layers having a thickness of 3 μm. Afterward, the plating resist layers were removed from the metal substrate, so that a metal substrate with plating layers was obtained. Besides, in this case, types of plating metals are not limited to the above-described metals, and every type of metals generally applicable to lead frames such as Ni/Pd/Au may be used for the present invention, and, in addition, every composition of plating may be used for the present invention. Next, a photo sensitive resist layers was formed on the whole of each of the front and back surfaces of the metal substrate again. And then, in order to form a protrusion 4, the both surfaces of the metal substrate 1 that were given the photo sensitive resist layers respectively were exposed to be developed through glass masks (HY2-50P: made by KONIKA MINOLTA ADVANCED LAYERS, INC.), one of the glass masks having had a pattern for forming an etching resist pattern layer having a width A of 40 μm (dummy pattern for controlling etching rate) on the packaging-surface side and the other of the glass masks having had a pattern for forming an etching resist pattern layer having a width B of 80 μm (dummy pattern for controlling etching rate) on the other-surface side which was exposed to the outside after sealing with resin (refer to FIG. 4) and these glass masks having been capable of forming the etching resist pattern layers for lead frame each of which had an outer shape larger than those of the above plating areas by 50 μm so as to be capable of wholly covering the plating areas, so that etching resist pattern layers for lead frame each having an etching resist pattern for forming a protrusion 4 were formed. And then, the extremely thin etching resist layers 3 for forming protrusion slowed down progress of etching for the portion, so that a lead frame which included a protrusion 4 having a width E of 70 μm (an amount of the protrusion projecting from the edge of the upper surface in the horizontal direction), a height G of 100 μm (an amount of the protrusion projecting from the upper surface in the downward direction), and a thickness F of 50 μm was formed (refer to the central part of the list shown in FIG. 5). In this case, an opening between the etching resist layer 2 for forming lead frame and the etching resist layer 3 for forming the protrusion 4 was formed to have a width C of 40 μm on the packaging-surface side, and an opening between the etching resist layer 2 for forming lead frame and the etching resist layer 3 for forming the protrusion 4 was formed to have a width D of 120 μm on the other-surface side which was exposed to the outside after sealing with resin (refer to FIG. 4). Also, in forming protrusions by etching in forming the lead frame, the etching resist pattern layers were removed from the metal substrate after the etching. In addition, portions of the surface of the band-shaped lead frame which were not covered with the etching resist pattern layers and which included protrusions were roughened with a roughening solution of an organic acid system or a hydrogen peroxide-sulfic acid system so that the portions of the surface of band-shaped lead frame which were not covered with the etching resist pattern layers had a roughness average (Ra) of 0.12 to 0.2 μm, with the etching resist pattern layers not removed from the band-shaped lead frame (refer to FIGS. 9 and 10), and afterward, the etching resist pattern layers were peeled off. As a result, a lead frame which included a lateral-side protrusion for mold-lock and the surfaces of which were rough surfaces with improved adhesiveness to resin was obtained.

Comparative Example

A band-shaped cupper material (KLF-194: made by Kobe Steel, Ltd.) having a thickness of 0.2 mm and a width of 180 mm was used as a metal substrate 1 for lead frame, and photo sensitive resist layers (negative-type photo sensitive resist AQ-2058: made by Asahi Kasei E-materials Corporation.) each having a thickness of 20 μm were formed on the both surfaces of this metal substrate respectively. And then, in order to form a protrusion 4, the both surfaces of the metal substrate 1 that were given the photo sensitive resist layers respectively were exposed to be developed through a glass mask for etching resist pattern for lead frame (HY2-50P: made by KONIKA MINOLTA ADVANCED LAYERS, INC.), the glass mask having had a pattern for forming an etching resist pattern layer having a width B of 110 μm only on the surface side which was exposed after sealing with resin (refer to FIG. 6), so that etching resist pattern layers for lead frame were formed. And then, the metal substrate 1 having been provided with the etching resist pattern layers was given an etching process. As a result, the extremely thin etching resist layer 3 for forming protrusion which was given on the surface side that was exposed to the outside after sealing with resin slowed down progress of etching for the portion, so that a lead frame which included a protrusion 4 was made. In this case, an opening between the etching resist layer 2 for forming lead frame and the resist layer 3 for forming the protrusion 4 was formed to have a width D of 125 μm (refer to FIG. 6). However, the thickness of the formed protrusion 4 was 15 μm and thin. Also, the protrusion partially deformed or a part of the protrusion disappeared, and, in addition, the shape of the top end of the protrusion was sharp. Accordingly, there was a large possibility that the shape of the top end of the protrusion in the comparative example caused deficiency of adhesiveness to the lead frame after sealing with resin or became a starting point of a crack in resin (refer to FIG. 2).

The invention claimed is:

1. A lead frame comprising:
   a semiconductor-mounting part having an upper surface;
   a semiconductor element mounted in the upper surface;
   a terminal part an upper surface of which is used for wire bonding of the semiconductor element;
   a protrusion is formed on a lateral side of at least one of the semiconductor-mounting part and the terminal part, an upper side of the protrusion horizontally projects beyond an edge of a lower surface of the semiconductor-mounting part and the terminal part and the protrusion runs slantingly and downward from a lower side of the projecting upper side of the protrusion so that the protrusion horizontally projects beyond an edge of the upper surface of the semiconductor-mounting part or the terminal part and also projects downward from the upper side, the protrusion is formed to have a top end that is approximately flat or is formed to have a top end the cross section of which has an arc-like profile, the top end of the protrusion being thick and inclined, a lower surface of the protrusion having a hollow, and a highest position of the hollow is higher than a lowest position of the top end of the protrusion.

2. A lead frame according to claim 1, wherein surfaces of the lateral sides of the semiconductor-mounting part and the terminal part are roughened through roughening treatment.

3. A lead frame according to claim 2, wherein at least one of the roughened surfaces of the lateral sides of the semiconductor-mounting part and terminal part is not plated.

4. A lead frame according to claim 2, wherein the roughened surfaces have a roughness average (Ra) of 0.12 to 0.2 μm.

5. A lead frame according to claim 1, wherein a thickness of the protrusion is 30 μm or more.

6. A lead frame comprising:
   a semiconductor-mounting part an upper surface of which is provided with a semiconductor element; and
   a terminal part an upper surface of which is used for wire bonding of the semiconductor element,
   wherein a protrusion is formed on a lateral side of at least one of the semiconductor-mounting part and the terminal part, an upper side of the protrusion horizontally projects beyond an edge of a lower surface of the semiconductor-mounting part or the terminal part and the protrusion runs slantingly and downward from a lower side of the projecting upper side of the protrusion so that the protrusion horizontally projects beyond an edge of the upper surface of the semiconductor-mounting part or the terminal part and also projects downward from the upper side, and a top end of the protrusion is 25 µm or more in thickness and inclined, a lower surface of the protrusion having a hollow, and a highest position of the hollow is higher than a lowest position of the top end of the protrusion.

7. A lead frame according to claim 6, characterized in that wherein an amount of the protrusion horizontally projecting from an edge of the upper surface of the semiconductor-mounting part or the terminal part is 10 µm or more.

8. A lead frame according to claim 6, wherein an amount of the protrusion horizontally projecting from an edge of the upper surface of the semiconductor-mounting part or the terminal part is 40 µm or more.

9. A lead frame according to claim 6, wherein an amount of the protrusion projecting downward from the upper surface of the semiconductor-mounting part or the terminal part is 85 µm or more.

10. A lead frame comprising:
a semiconductor-mounting part an upper surface of which is provided with a semiconductor element; and
a terminal part an upper surface of which is used for wire bonding of the semiconductor element,
wherein a protrusion is formed on a lateral side of at least one of the semiconductor-mounting part and the terminal part, an upper side of the protrusion horizontally projects beyond an edge of the lower surface of the semiconductor-mounting part or the terminal part, the protrusion horizontally projects on a lower side of the projecting upper side of the protrusion beyond an edge of the upper surface of the semiconductor-mounting part or the terminal part, and a top end of the protrusion inclined, the protrusion further includes a portion running downward from a lower-side corner of the top end of the protrusion, a lower surface of the protrusion having a hollow, and a highest position of the hollow is higher than a lowest position of the top end of the protrusion.

* * * * *